United States Patent
Archibald et al.

(10) Patent No.: US 8,626,346 B2
(45) Date of Patent: Jan. 7, 2014

(54) DYNAMICALLY ADJUSTABLE FLOOR TILE FOR A DATA CENTER

(75) Inventors: Matthew R. Archibald, Morrisville, NC (US); Jerrod K. Buterbaugh, Wake Forest, NC (US)

(73) Assignee: International Business Machines Corporation, Armonk, NY (US)

( * ) Notice: Subject to any disclaimer, the term of this patent is extended or adjusted under 35 U.S.C. 154(b) by 498 days.

(21) Appl. No.: 12/852,091

(22) Filed: Aug. 6, 2010

(65) Prior Publication Data

US 2012/0035781 A1 Feb. 9, 2012

(51) Int. Cl.
*G06F 19/00* (2011.01)

(52) U.S. Cl.
USPC .......................................... 700/278; 700/300

(58) Field of Classification Search
USPC .......... 700/278, 299, 300, 301; 702/132, 130; 62/259.2, 263
See application file for complete search history.

(56) References Cited

U.S. PATENT DOCUMENTS

| | | | |
|---|---|---|---|
| 3,065,686 A | 11/1962 | Geocaris | |
| 3,318,225 A | 5/1967 | May | |
| 4,158,875 A | 6/1979 | Tajima et al. | |
| 4,335,647 A | 6/1982 | Timmons | |
| 4,531,454 A | 7/1985 | Spoormaker | |
| 4,775,001 A | 10/1988 | Ward et al. | |
| 5,345,779 A | 9/1994 | Feeney | |
| 5,769,702 A | 6/1998 | Hanson | |
| 5,995,368 A | 11/1999 | Lee et al. | |
| 6,183,359 B1 | 2/2001 | Klein et al. | |
| 6,193,601 B1 | 2/2001 | Torczynski | |
| 6,222,729 B1 | 4/2001 | Yoshikawa | |
| 6,318,113 B1 | 11/2001 | Levy et al. | |
| 6,328,776 B1 | 12/2001 | Shanks et al. | |
| 6,402,613 B1 | 6/2002 | Teagle | |
| 6,491,578 B2 | 12/2002 | Yoshinori et al. | |
| 6,526,702 B2 | 3/2003 | Jones | |
| 6,557,357 B2 | 5/2003 | Spinazzola et al. | |
| 6,574,104 B2 | 6/2003 | Patel et al. | |
| 6,574,970 B2 | 6/2003 | Spinazzola et al. | |
| 6,616,524 B2 | 9/2003 | Storck, Jr. et al. | |
| 6,648,752 B2 * | 11/2003 | Vernier et al. | 454/304 |
| 6,672,955 B2 | 1/2004 | Charron | |

(Continued)

FOREIGN PATENT DOCUMENTS

| | | |
|---|---|---|
| CN | 101173817 A | 5/2008 |
| CN | 101437385 (A) | 5/2009 |
| CN | 100533343 (C) | 8/2009 |
| CN | 201319718 Y | 9/2009 |

OTHER PUBLICATIONS

IBM, "Automatic Opening Floor Tile for Back-up Air Cooling of Server Racks", IP.Com Prior Art Database, Jul. 18, 2005, pp. 1-5, IP.com No. IPCOM000126445D, IP.com.

(Continued)

*Primary Examiner* — Kidest Bahta
(74) *Attorney, Agent, or Firm* — H. Barrett Spraggins; Katherine S. Brown; Biggers Kennedy Lenart Spraggins LLP (57) ABSTRACT

A dynamically adjustable floor tile for a data center including a plurality of perforations; and a dynamically adjustable aperture, wherein opening the aperture exposes one or more of the perforations to airflow through the floor tile and closing the aperture blocks one or more of the apertures to airflow through the floor tile.

20 Claims, 7 Drawing Sheets

(56) References Cited

U.S. PATENT DOCUMENTS

| | | | |
|---|---|---|---|
| 6,694,759 B1* | 2/2004 | Bash et al. ............... | 62/180 |
| 6,747,872 B1* | 6/2004 | Patel et al. ............... | 361/695 |
| 6,819,563 B1 | 11/2004 | Chu et al. | |
| 6,826,456 B1* | 11/2004 | Irving et al. .............. | 700/299 |
| 6,862,179 B2 | 3/2005 | Beitelmal et al. | |
| 6,882,531 B2 | 4/2005 | Modica | |
| 6,957,544 B2 | 10/2005 | Dobbs et al. | |
| 7,050,300 B2 | 5/2006 | Hein | |
| 7,074,123 B2 | 7/2006 | Bettridge et al. | |
| 7,170,745 B2 | 1/2007 | Bash et al. | |
| 7,214,131 B2 | 5/2007 | Malone | |
| 7,251,547 B2* | 7/2007 | Bash et al. ............... | 700/276 |
| 7,259,963 B2 | 8/2007 | Germagian et al. | |
| 7,266,964 B2 | 9/2007 | Vogel et al. | |
| 7,347,058 B2 | 3/2008 | Malone et al. | |
| 7,361,081 B2 | 4/2008 | Beitelmal et al. | |
| 7,379,298 B2 | 5/2008 | Walsh et al. | |
| 7,486,511 B1 | 2/2009 | Griffel et al. | |
| 7,568,360 B1 | 8/2009 | Bash et al. | |
| 7,643,291 B2 | 1/2010 | Mallia et al. | |
| 7,656,660 B2 | 2/2010 | Hoeft et al. | |
| 7,862,410 B2 | 1/2011 | McMahan et al. | |
| 7,869,210 B2 | 1/2011 | Moss | |
| 7,878,889 B2* | 2/2011 | Day ........................ | 454/184 |
| 7,903,407 B2 | 3/2011 | Matsushima et al. | |
| 7,907,402 B2 | 3/2011 | Caveney | |
| 7,957,139 B2 | 6/2011 | Davis et al. | |
| 7,986,526 B1 | 7/2011 | Howard et al. | |
| 8,054,625 B2 | 11/2011 | Noteboom et al. | |
| 8,175,753 B2 | 5/2012 | Sawczak et al. | |
| 2003/0067745 A1* | 4/2003 | Patel et al. ............... | 361/690 |
| 2005/0159099 A1* | 7/2005 | Malone ..................... | 454/186 |
| 2005/0237716 A1 | 10/2005 | Chu et al. | |
| 2006/0199508 A1 | 9/2006 | Nair et al. | |
| 2006/0260338 A1 | 11/2006 | VanGilder et al. | |
| 2007/0167125 A1 | 7/2007 | Rasmussen et al. | |
| 2007/0173189 A1 | 7/2007 | Lewis | |
| 2008/0204999 A1 | 8/2008 | Clidaras et al. | |
| 2008/0269932 A1 | 10/2008 | Chardon et al. | |
| 2008/0285232 A1 | 11/2008 | Claassen et al. | |
| 2009/0012633 A1 | 1/2009 | Liu et al. | |
| 2009/0031896 A1 | 2/2009 | Abraham et al. | |
| 2009/0059523 A1 | 3/2009 | Mallia et al. | |
| 2009/0061755 A1 | 3/2009 | Calder et al. | |
| 2009/0107652 A1 | 4/2009 | VanGilder et al. | |
| 2009/0156114 A1* | 6/2009 | Ahladas et al. ........... | 454/184 |
| 2009/0173017 A1 | 7/2009 | Hall | |
| 2009/0277605 A1 | 11/2009 | Vangilder et al. | |
| 2009/0305625 A1 | 12/2009 | Dawson et al. | |
| 2010/0027216 A1 | 2/2010 | Matsushima et al. | |
| 2010/0035535 A1 | 2/2010 | Taylor | |
| 2010/0041327 A1 | 2/2010 | Desler | |
| 2010/0064610 A1 | 3/2010 | Kulkarni et al. | |
| 2010/0067745 A1* | 3/2010 | Kovtun et al. ............ | 382/106 |
| 2010/0126696 A1 | 5/2010 | Novotny et al. | |
| 2010/0151781 A1 | 6/2010 | Slessman et al. | |
| 2010/0263830 A1 | 10/2010 | Noteboom et al. | |
| 2011/0189936 A1 | 8/2011 | Haspers et al. | |
| 2011/0288664 A1 | 11/2011 | Archibald et al. | |
| 2012/0020009 A1 | 1/2012 | Archibald et al. | |
| 2012/0033368 A1 | 2/2012 | Archibald et al. | |
| 2012/0035781 A1 | 2/2012 | Archibald et al. | |
| 2012/0072195 A1 | 3/2012 | Archibald et al. | |
| 2012/0243173 A1 | 9/2012 | Archibald et al. | |
| 2013/0178144 A1 | 7/2013 | Archibald et al. | |
| 2013/0200764 A1 | 8/2013 | Archibald et al. | |

OTHER PUBLICATIONS

IBM, "Dynamic Thermal Mapping and Trend Analysis As A Control Mechanism for HVAC Systems in Data Centers," IP.Com Prior Art Database, Mar. 27, 2006, pp. 1-3, IP.com No. IPCOM000135036D, IP.com.

Disclosed Anonymously, "Method for a Managed Airflow Server Cabinet", IP.Com Prior Art Database, Apr. 26, 2006, pp. 1-7, IP.com No. IPCOM000135845D, IP.com.

IBM, "Apparatus and Method for Measuring Volumetric Airflow Rates for a BlueGene Rack or Rack Assembly with Vertical Airflow", IP.Com Prior Art Database, Jun. 18, 2008, pp. 1-9, IP.com No. IPCOM000171776D, IP.com.

IBM, "The Cooling Control System of Server", IP.Com Prior Art Database, Dec. 29, 2009, pp. 1-4, IP.com No. IPCOM000191308D, IP.com.

El-Hakim, S.F., et al., "Sensor Based Creation of Indoor Virtual Environment Models", Proceedings of the 1997 International Conference on Virtual Systems and MultiMedia, VSMM '97, Sep. 10-12, 1997, pp. 50-58, IEEE Computer Society , Washington, DC, USA. DOI: 10.1109VSMM.1997.622327.

Office Action, U.S. Appl. No. 12/851,992, mailed Feb. 21, 2012, pp. 1-9.

Notice of Allowance, U.S. Appl. No. 12/851,992, mailed May 9, 2012, pp. 1-7.

Office Action, U.S. Appl. No. 12/840,863, mailed Jan. 26, 2012, pp. 1-11.

Notice of Allowance, U.S. Appl. No. 12/840,863, mailed Mar. 22, 2012, pp. 1-7.

Final Office Action, U.S. Appl. No. 12/781,915, mailed Oct. 24, 2013, pp. 1-10.

Office Action, U.S. Appl. No. 12/781,915, mailed Apr. 26, 2013, pp. 1-13.

Final Office Action, U.S. Appl. No. 12/852,091, mailed Apr. 23, 2013, pp. 1-11.

Notice of Allowance, U.S. Appl. No. 12/852,091, mailed Aug. 21, 2013, pp. 1-13.

Office Action, U.S. Appl. No. 12/852,091, mailed Nov. 26, 2012, pp. 1-11.

Final Office Action, U.S. Appl. No. 12/885,456, mailed Sep. 10, 2013, pp. 1-9.

Office Action, U.S. Appl. No. 12/885,456, mailed Mar. 19, 2013, pp. 1-20.

\* cited by examiner

DYNAMICALLY ADJUSTABLE FLOOR TILE FOR A DATA CENTER

BACKGROUND OF THE INVENTION

1. Field of the Invention

The field of the invention is cooling computers in data centers.

2. Description of Related Art

Typical data centers have floors that include floor tiles that are perforated. Air cooled from air conditioners located either above the floor or below the floor is blown from beneath the floor of the data center through the perforated tiles to cool the computers. The chassis containing the individual computers in the data center often have fans to blow cooled air from the front of the chassis to the back of the chassis to cool the computers. Typical data centers use static perforated floor tiles having the same size perforations for all the tiles of the floor without regard to any particular computers being cooled or any particular locations in the data center.

SUMMARY OF THE INVENTION

A dynamically adjustable floor tile for a data center including a plurality of perforations; and a dynamically adjustable aperture, wherein opening the aperture exposes one or more of the perforations to airflow through the floor tile and closing the aperture blocks one or more of the perforations from receiving airflow through the floor tile.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
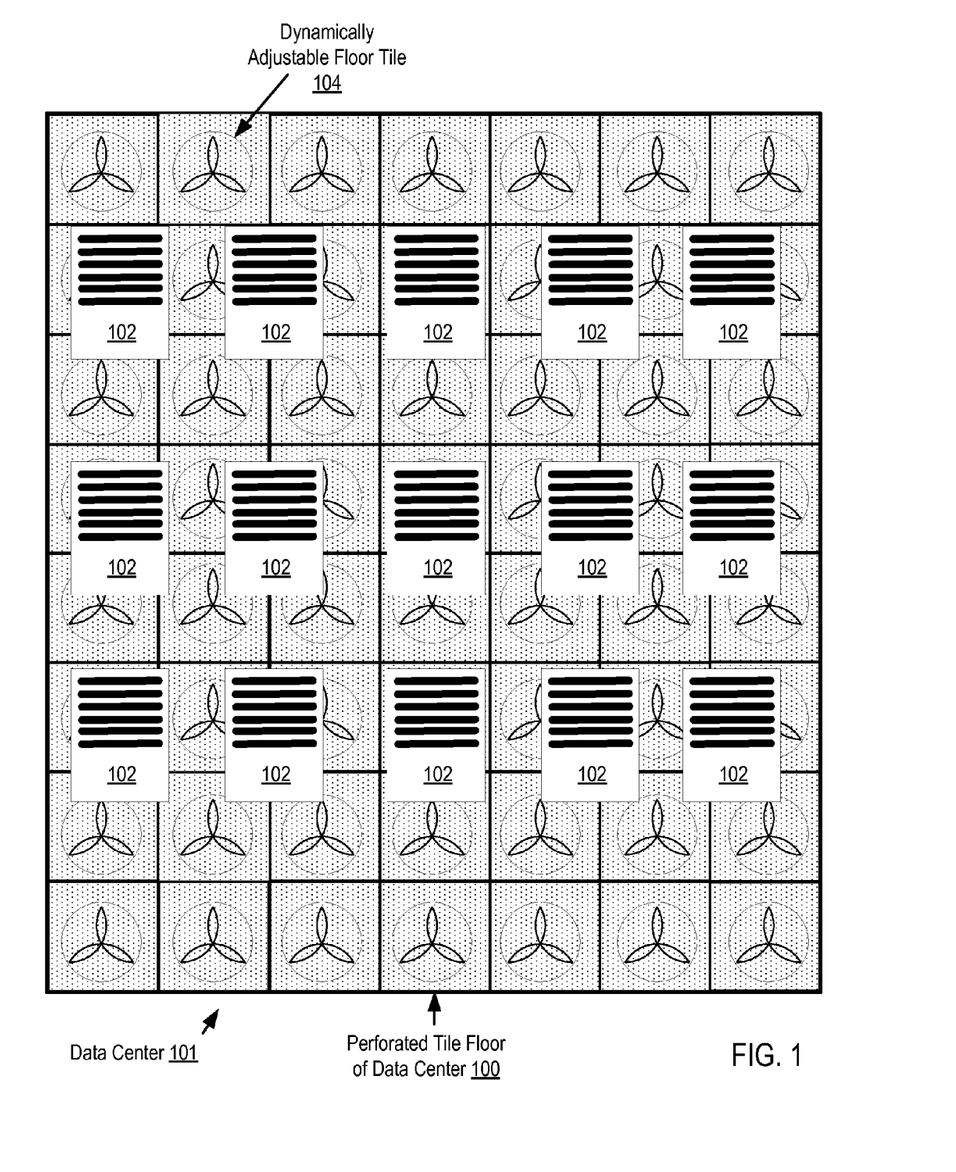
FIG. 1 sets forth a block diagram of an aerial view of a data center cooled according to embodiments of the present invention.

Exemplary dynamically adjustable floor tiles for data centers and methods and computer program products for cooling one or more computers in a data center in accordance with the present invention are described with reference to the accompanying drawings, beginning with FIG. 1. FIG. 1 sets forth a block diagram of an aerial view of a data center cooled according to embodiments of the present invention. A data center is a facility used to house computer systems and associated components, such as telecommunications and storage systems. Data centers also typically include redundant or backup power supplies, redundant data communications connections, and environmental controls such as air conditioning, fire suppression, and security devices.

The data center (101) of FIG. 1 includes a number of chassis (102) of computers. Each chassis (102) in the example of FIG. 1 houses individual computers cooled according to embodiments of the present invention. Such chassis may include for example blade environments including chassis of blade servers, server racks and others as will occur to those of skill in the art.

The data center (101) of FIG. 1 also has a perforated tile floor (100). One or more air conditioners in the data center in the example of FIG. 1 cool air which is then blown from beneath the perforated tile floor (100) of FIG. 1 through dynamically adjustable perforated floor tiles (104) to cool the chassis (102) of computers. The dynamically adjustable floor tiles (104) of FIG. 1 include a plurality of perforations allowing cooled air to pass through one or more of the perforations in the floor tile when a dynamically adjustable aperture is opened. Opening the adjustable aperture of the dynamically adjustable floor tile exposes the one or more perforations receiving airflow through the floor tile. The dynamically adjustable aperture of the floor tile also may be closed to block airflow one or more of the perforations from receiving airflow through the floor tile. By dynamically adjusting the apertures of the individual floor tiles of the perforated tile floor (100) of FIG. 1 the amount of cooled air blown through each floor tile may be adjusted to provide more cooling in some areas of the data center and less in other areas of the data center thereby providing a more efficiently and effectively cooled data center.

The adjustable floor tiles (104) of FIG. 1 each include a plurality of apertures and a plurality of fins. The fins in the example of FIG. 1 are attached to the adjustable floor tile and attached such that they rotate. Rotating one or more fins of the adjustable floor tiles (104) of FIG. 1 opens the one or more apertures allowing cooled air to blow from beneath the perforated tile floor (100) through one or more perforations of the particular dynamically adjustable floor tile. Rotating the one or more fins to a closed position closes the one or more apertures thereby blocking one or more of the perforations of the floor tile from receiving air through the floor tile.

In alternative embodiments, the dynamically adjustable aperture of the floor tiles of the present invention, may be various sizes, shapes and forms including for example, one or more vanes attached to the adjustable floor tile wherein opening the one or more vanes opens the one or more apertures and closing the one or more vanes closes the one or more apertures, circular expandable apertures, pneumatically controlled bladders, and others as will occur to those of skill in the art. In still further embodiments, the perforations themselves may contain the apertures such that the closing the aperture closes the perforation and opening the aperture opens the perforation.

In some embodiments of the present invention, each dynamically adjustable floor tile (104) of FIG. 1 is capable of dynamically adjusting in dependence upon temperature indicators. Such temperature indicators may be collected by the dynamically adjustable floor tile itself or by one or more computers in the data center. Each temperature indicator provides an indication of the temperature of a particular computer in a particular location of the data center. Examples of temperature indicators include internal temperature one or more chassis of computers in a particular location in the data center, a current fan speed in one or more chassis of computers in a particular location of the data center, processor usage information for one or more of one or more computers in a particular location in a data center, and other temperature indicators that will occur to those of skill in the art.

In the example of FIG. 1, the dynamically adjustable floor tiles (104) include an aperture adjustment module, a module of automated computing machinery including a processor and computer memory and an aperture adjustment application stored in the computer memory including computer program instructions for receiving, from one or more computers in the data center, temperature indicators; determining an aperture position in dependence upon the temperature indicators; and setting the aperture to the aperture position.

In alternative embodiments of the present invention, one or more computers in the data center may operate as a management module for the data center and receive temperature indicators from computers in the data center. In such embodiments, the adjustable floor tiles include an aperture adjustment module including a processor and computer memory and an aperture adjustment application stored in memory including computer program instructions for receiving, from one or more computers in the data center operating as a management module, an aperture position and setting the aperture to the aperture position.

The arrangement of computers, dynamic adjustable floor tiles, perforated tile floors, chassis, and other devices making up the exemplary system illustrated in FIG. 1 are for explanation, not for limitation. Data processing systems useful according to various embodiments of the present invention may include additional servers, routers, other devices, and peer-to-peer architectures, not shown in FIG. 1, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 1.

Figure 2:
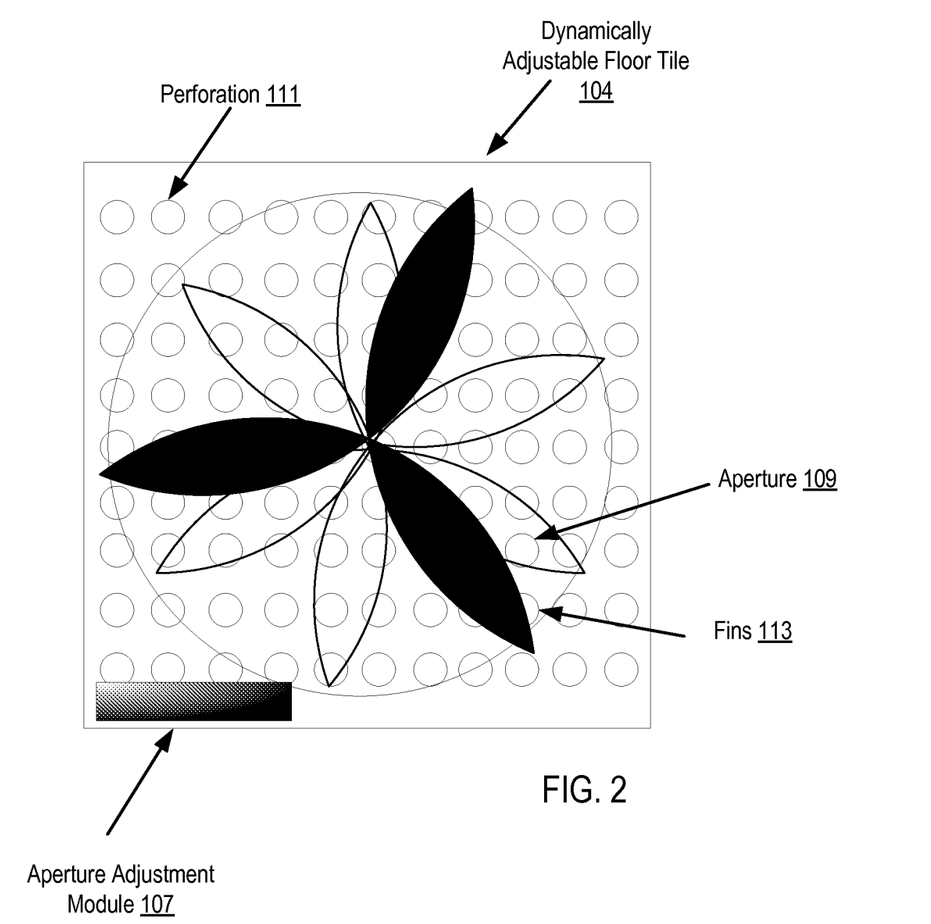
FIG. 2 sets forth a line drawing of a dynamically adjustable floor tile for a data center according to embodiments of the present invention.

For further explanation, FIG. 2 sets forth a line drawing of a dynamically adjustable floor tile (104) for a data center according to embodiments of the present invention. The floor tile (104) includes a plurality of perforations (111). The perforations of FIG. 2 are implemented as circular holes in the floor tile. In alternative embodiments, the perforations may be implemented in any number of shapes and sizes for airflow as will occur to those of skill in the art.

The dynamically adjustable floor tile (104) of FIG. 2 also includes a dynamically adjustable aperture (109). The dynamically adjustable aperture includes a plurality of apertures (109) and a plurality of fins (113). The fins (113) in the example of FIG. 2 are attached to the adjustable floor tile (104) and are attached in manner that allow the one or more fins to rotate. Rotating one or more fins (113) opens the one or more apertures (109) in the example of FIG. 2. Opening the one or more apertures (109) in the example of FIG. 2 exposes one or more of the perforations (111) to receiving airflow through the floor tile (104). Rotating the one or more fins (113) in the example of FIG. 2 closes the one or more apertures (109). Closing the one or more aperture (109) in the example of FIG. 2 blocks the one or more of the perforations from receiving airflow through the floor tile.

The dynamically adjustable floor tile (104) of FIG. 2 also includes an aperture adjustment module (107) including a processor and computer memory and an aperture adjustment application stored in memory including computer program instructions for receiving, from one or more computers in the data center, temperature indicators; determining an aperture position in dependence upon the temperature indicators; and setting the aperture to the aperture position. In the example of FIG. 2 an aperture position is implemented as a positioning of the fins (113) to expose a particular number of perforations to airflow from beneath the data center. In alternative embodiments the aperture adjustment module includes computer program instructions for receiving, from one or more computers in the data center operating as a management module, an aperture position and setting the aperture to the aperture position.

Figure 3:
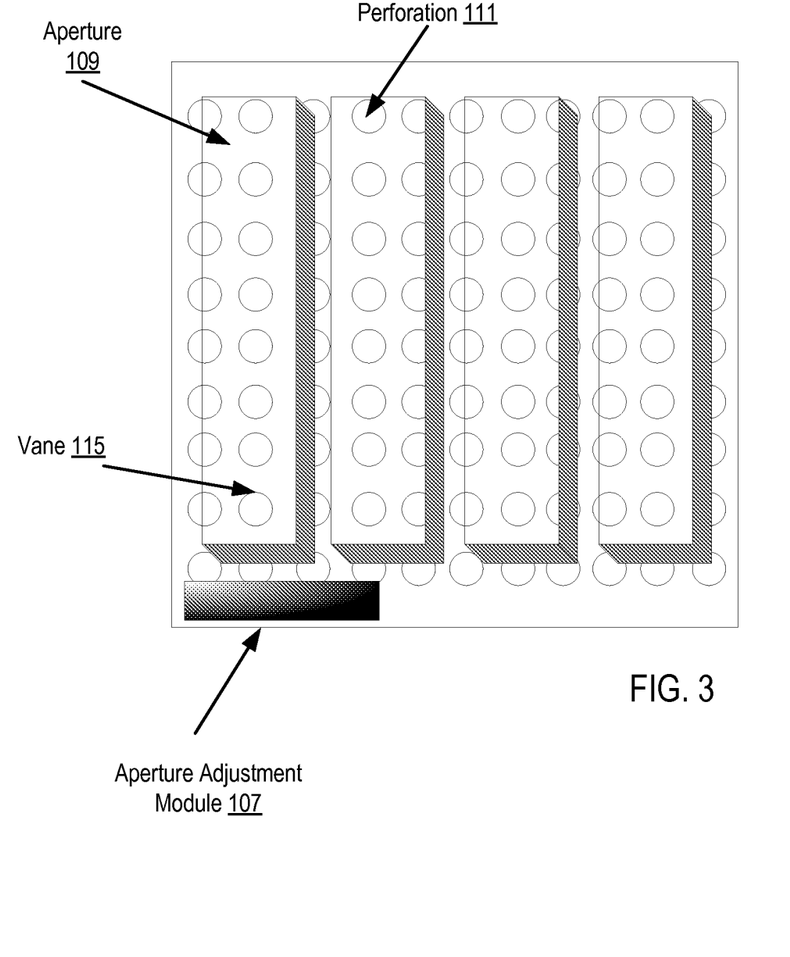
FIG. 3 sets forth a line drawing of another example dynamically adjustable floor tile for a data center according to embodiments of the present invention.

For further explanation, FIG. 3 sets forth a line drawing of another example dynamically adjustable floor tile (104) for a data center according to embodiments of the present invention. The floor tile (104) of FIG. 3 is similar to the floor tile of FIG. 2 in that the floor tile of FIG. 3 includes a plurality of perforations (111) implemented as circular holes in the floor tile and a dynamically adjustable aperture (109). The dynamically adjustable aperture includes a plurality of apertures (109) and a plurality of vanes (115) attached to the adjustable floor tile. In the example of FIG. 3 opening the one or more vanes (115) opens the one or more apertures and closing the one or more vanes closes the one or more apertures. Opening the one or more apertures (109) in the example of FIG. 3 exposes one or more of the perforations (111) to receiving airflow through the floor tile (104). Closing the one or more apertures (109), in the example of FIG. 3, blocks the one or more perforations from receiving airflow through the floor tile.

The dynamically adjustable floor tile (104) of FIG. 3 also includes an aperture adjustment module (107) including a processor and computer memory and an aperture adjustment application stored in memory including computer program instructions for receiving, from one or more computers in the data center, temperature indicators; determining an aperture position in dependence upon the temperature indicators; and setting the aperture to the aperture position. In the example of FIG. 2 an aperture position is implemented as a positioning of the vanes (115) to expose a particular number of perforations to airflow from beneath the data center. In alternative embodiments the aperture adjustment module includes computer program instructions for receiving, from one or more computers in the data center operating as a management module, an aperture position and setting the aperture to the aperture position.

Figure 4:
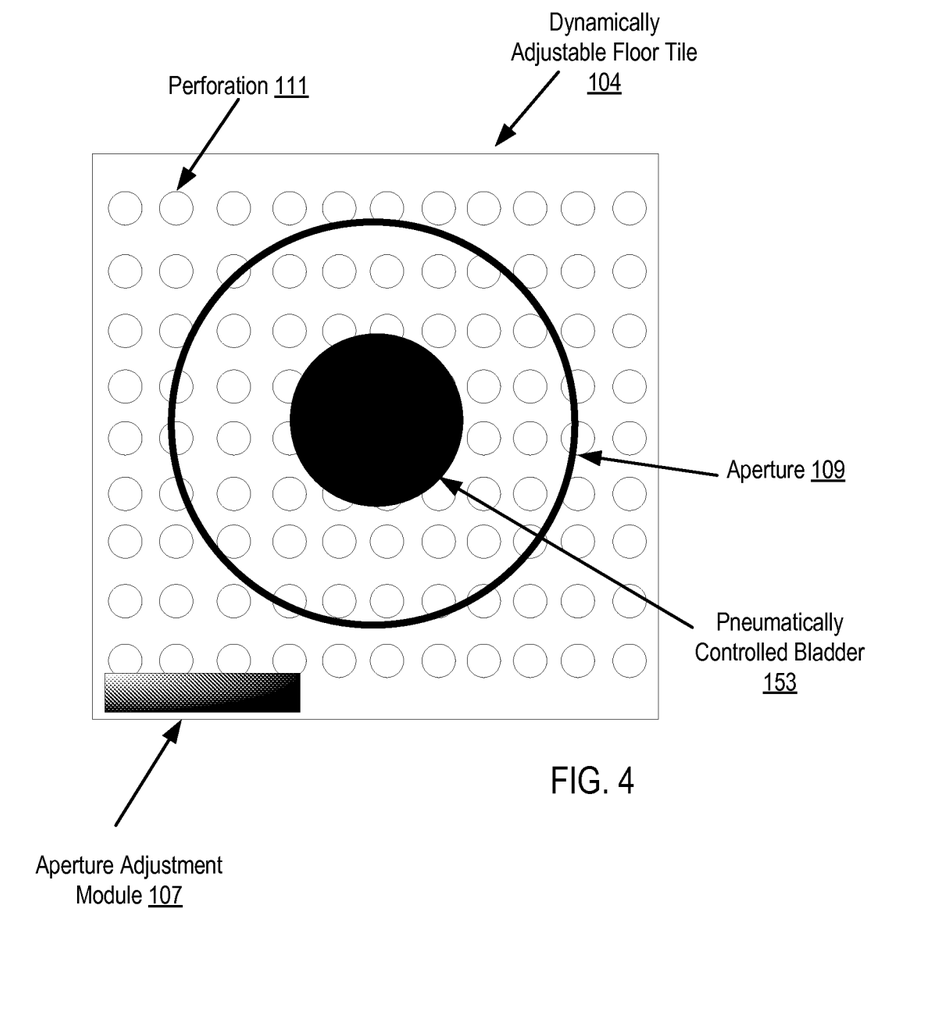
FIG. 4 sets forth a line drawing of another example dynamically adjustable floor tile for a data center according to embodiments of the present invention.

For further explanation, FIG. 4 sets forth a line drawing of another example dynamically adjustable floor tile (104) for a data center according to embodiments of the present invention. The floor tile (104) of FIG. 4 is similar to the floor tile of FIG. 2 and FIG. 3 in that the floor tile of FIG. 4 includes a plurality of perforations (111) implemented as circular holes in the floor tile and a dynamically adjustable aperture (109). The dynamically adjustable aperture includes a plurality of apertures (109) and a pneumatically controlled bladder (153) attached to the adjustable floor tile (104). In the example of FIG. 4, deflating the bladder (153) opens the aperture and inflating the bladder (153) closes the aperture. Opening the one or more apertures (109) in the example of FIG. 4 exposes one or more of the perforations (111) to receiving airflow through the floor tile (104). Closing the one or more apertures (109), in the example of FIG. 4, blocks the one or more perforations from receiving airflow through the floor tile.

The dynamically adjustable floor tile (104) of FIG. 4 also includes an aperture adjustment module (107) including a processor and computer memory and an aperture adjustment application stored in memory including computer program instructions for receiving, from one or more computers in the data center, temperature indicators; determining an aperture position in dependence upon the temperature indicators; and setting the aperture to the aperture position. In the example of FIG. 2 an aperture position is implemented as a degree of inflation of the pneumatically controlled bladder to expose a particular number of perforations to airflow from beneath the data center. In alternative embodiments the aperture adjustment module includes computer program instructions for receiving, from one or more computers in the data center operating as a management module, an aperture position and setting the aperture to the aperture position.

In the example of FIG. 4, only one bladder and only one aperture are illustrated. This is for explanation and not for limitation. In fact, dynamically adjustable floor tiles according to the present invention may include any number of apertures and bladders. Furthermore, in some alternative embodiments, inflating the one or more bladders opens the apertures and deflating the one or more bladders closes the apertures as will occur to those of skill in the art.

Figure 5:
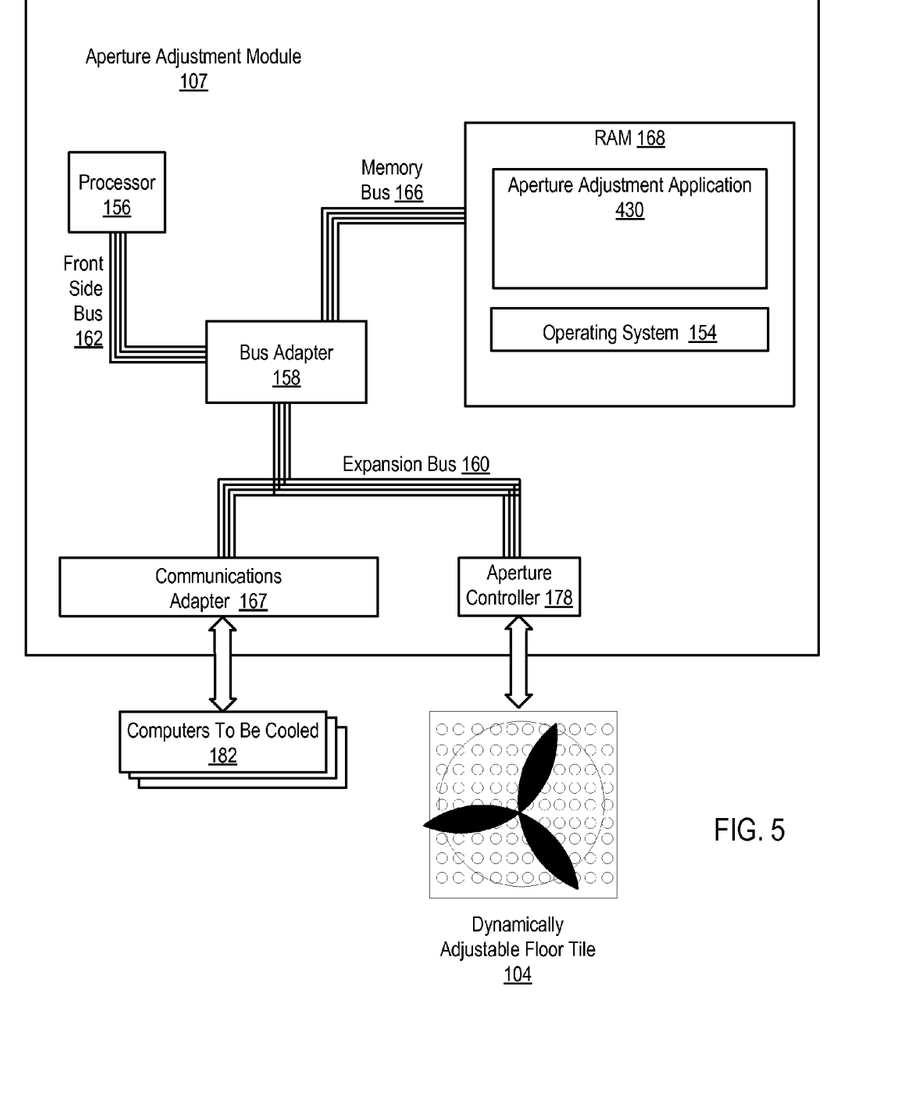
FIG. 5 sets forth a block diagram of an exemplary aperture adjustment module.

For further explanation, FIG. 5 sets forth a block diagram of an exemplary aperture adjustment module (107), a module of automated computing machinery for dynamically adjustable floor tiles and cooling one or more computers in a data center according to the present invention. The aperture adjustment module (107) of FIG. 5 includes at least one computer processor (156) or 'CPU' as well as random access memory (168) (RAM') which is connected through a high speed memory bus (166) and bus adapter (158) to processor (156), to an aperture controller (178) for a dynamically adjustable floor tile (107) through an expansion buss and to other components of the aperture adjustment module (107).

Stored in RAM (168) is an aperture adjustment application (430), a module of computer program instructions for controlling dynamically adjustable floor tiles and for cooling computers in data centers according to embodiments of the present invention. The aperture adjustment application (430) includes computer program instructions for receiving, from one or more computers in the data center, temperature indicators; determining an aperture position for the dynamically adjustable floor tile (104) in dependence upon the temperature indicators; and setting the aperture to the aperture position of the dynamically adjustable floor tile (104). The aperture adjustment application (430) of FIG. 5 also includes computer program instructions for receiving, from one or more computers in the data center operating as a management module, an aperture position and setting the aperture to the aperture position.

Also stored in RAM (168) is an operating system (154). Operating systems useful in aperture adjustment modules according to embodiments of the present invention include UNIX™ Linux™ Microsoft XP™, AIX™ IBM's i5/OS™ and others as will occur to those of skill in the art. The operating system (154) and aperture adjustment application in the example of FIG. 5 are shown in RAM (168), but many components of such software typically are stored in non-volatile memory also, such as, for example, on a disk drive (170).

The exemplary aperture adjustment module (107) of FIG. 5 includes a communications adapter (167) for data communications with other computers (182). As mentioned above, in some embodiment of the present invention, other computers may send temperature indicators to the aperture adjust module. In such embodiments, the aperture adjustment application (430) is capable of receiving, from those computers in the data center, the temperature indicators; determining an aperture position in dependence upon the temperature indicators; and setting the aperture of the dynamically adjustable floor tile to the aperture position. In other embodiments of the present invention, other computers may send to the aperture adjustment module an aperture position. In such embodiments, the aperture adjustment application (430) is capable of receiving, from those computers in the data center, an aperture position; and setting the aperture of the dynamically adjustable floor tile to the aperture position.

Data communications with other computers (1982) in the example of FIG. 5 may be carried out serially through RS-232 connections, through external buses such as a Universal Serial Bus ('USB'), through data communications data communications networks such as IP data communications networks, and in other ways as will occur to those of skill in the art. Communications adapters implement the hardware level of data communications through which one computer sends data communications to another computer, directly or through a data communications network. Examples of communications adapters useful for aperture adjustment modules according to embodiments of the present invention include modems for wired dial-up communications, Ethernet (IEEE 802.3) adapters for wired data communications network communications, and 802.11 adapters for wireless data communications network communications.

Figure 6:
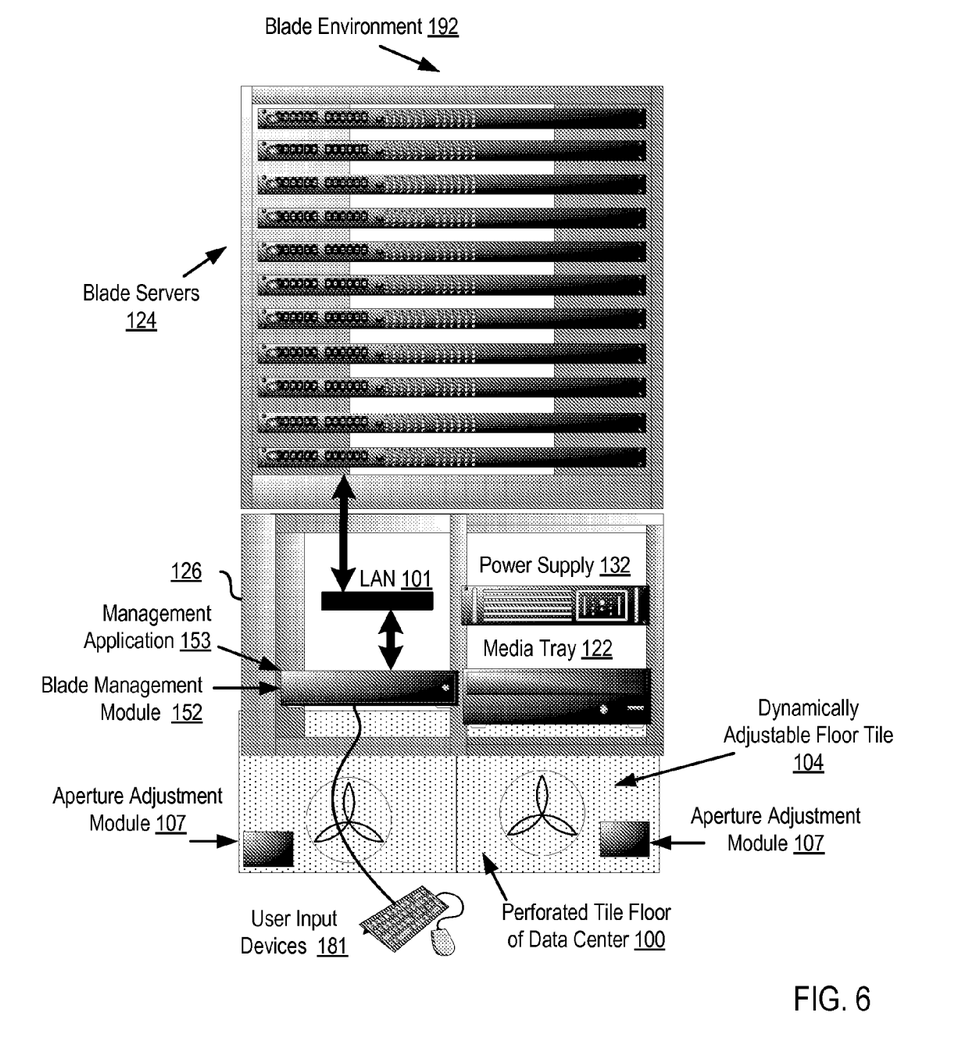
FIG. 6 sets forth a diagram of a front view of a system for cooling one or more computers in a data center according to embodiments of the present invention.

For further explanation, FIG. 6 sets forth a diagram of a front view of a system for cooling one or more computers in a data center according to embodiments of the present invention. The example of FIG. 6 includes a blade environment (192). 'Blade environment,' as the term is used in this specification, refers generally to a blade server system installed in this example in a two-bay chassis (126) and including a number of blade servers (124), one or more blade management modules (152), a media tray (122), and a blade server system power supply (132).

The blade management module (152) is a small computer in its own right, including software and hardware components, one or more computer processors and computer memory, that provides system management functions for all components in the example blade environment (192) including the blade servers (124) and the media tray (122). The blade management module of FIG. 4 also makes available connections for user input devices such as mice or keyboards (181) that are not generally connected directly to the blade servers or to the blade environment chassis. The blade servers themselves (124), installed in a cabinet bay (126) of the exemplary blade environment (192) in the example of FIG. 6, are several computing devices implemented in blade form factor. The blade servers share access to the media tray (122). The blade servers (124) are connected to one another and to the blade management module (152) for data communications through a local area network ('LAN') (101). The LAN (101) is a small network installed within the chassis of the blade environment.

The media tray (122) houses non-volatile memory media generally. A media tray may typically include Compact Disc read-only media drives (CD-ROM), Digital Video Disc ROM drives (DVD-ROM), CD-RW drives, DVD-RW drives, floppy disk drives, and so on as will occur those of skill in the art.

The system of FIG. 6 includes a perforated tile floor (100) that includes dynamically adjustable floor tiles (104) according to embodiments of the present invention. The system of FIG. 6 also includes an air conditioner (not shown) for blowing cooled air beneath the perforated tile floor (104). Each floor tile (104) in the example of FIG. 6 includes a dynamically adjustable aperture and an aperture adjustment module (107) capable of adjusting an aperture position of the dynamically adjustable floor tile.

In the example of FIG. 6, the blade management module (152) includes a management application (153) that controls the aperture positions of many dynamically adjustable floor tiles (104) in the data center. Management application (153) includes computer program instructions for receiving, from one or more computers in the data center, temperature indicators; identifying one or more floor tiles (104) predetermined to cool the one or more computers; determining an aperture position in dependence upon the temperature indicators for each identified floor tile (104); and setting the aperture of each identified floor tile (104) to its aperture position. The management application therefore may control the amount of cooled air provided to different locations of the data center in dependence upon temperature indicators for those particular locations in the data center.

The arrangement of the blade environment (192), network (101), and other devices making up the exemplary system illustrated in FIG. 6 are for explanation, not for limitation. Data processing systems useful according to various embodiments of the present invention may include additional servers, routers, and other devices, not shown in FIG. 6, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 6.

Figure 7:
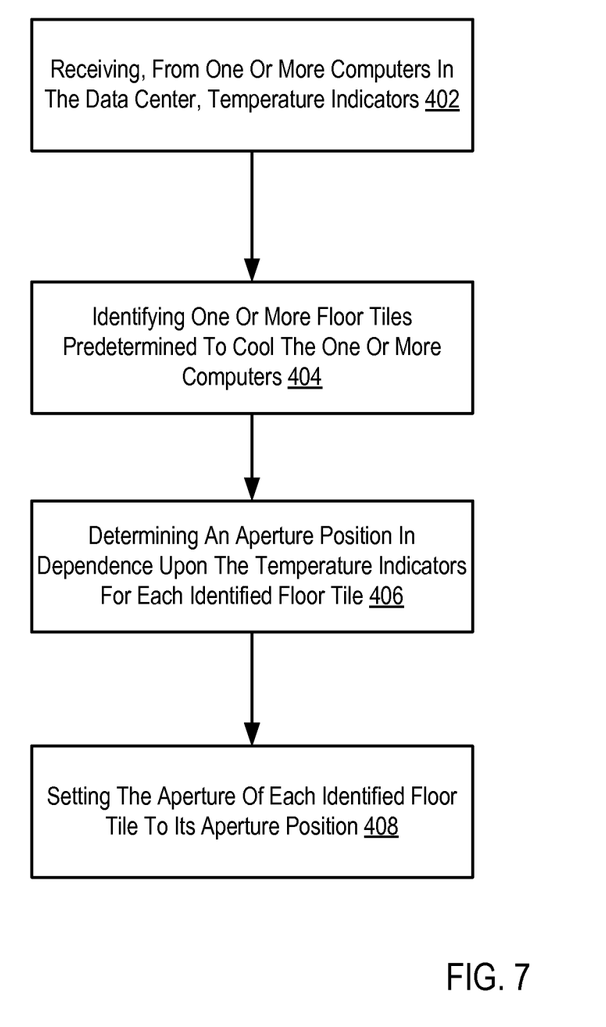
FIG. 7 sets forth a flow chart illustrating an exemplary method for cooling one or more computers in a data center.

For further explanation, FIG. 7 sets forth a flow chart illustrating an exemplary method for cooling one or more computers in a data center. Such a data center includes a perforated tile floor and an air conditioner for blowing cooled air beneath the perforated tile floor, and each floor tile includes a dynamically adjustable aperture. The method of FIG. 7 includes receiving (402), from one or more computers in the data center, temperature indicators. As mentioned, various temperature indicators include internal temperature in a chassis of computers, current fan speed in a chassis of one or more computers, processor usage information for one or more of the computers in the data center, and others as will occur to those of skill in the art. Such temperature indicators may be collected and maintained by one or more computers in the data center by periodically polling various computers in the data center or receiving periodically such temperature indicators. Such computers may then determine that one or more of the computers in the data center currently require more or less cooling and upon such determination adjust the dynamically adjustable floor tiles in locations in the data center close to the computers needing more or less cooling.

The method of FIG. 7 also includes identifying (404) one or more floor tiles predetermined to cool the one or more computers. Identifying (404) one or more floor tiles predetermined to cool the one or more computers may be carried out by looking up a floor tile ID on a table of floor tile IDs correlated by location in the data center to particular computer IDs.

The method of FIG. 7 also includes determining (406) an aperture position in dependence upon the temperature indicators for each identified floor tile. Determining (406) an aperture position in dependence upon the temperature indicators for each identified floor tile may include determining a rotation position for a fin of a dynamically adjustable floor tile, determining the degree to which a vane is to be opened on a dynamically adjustable floor tile, and in other ways as will occur to those of skill in the art. Such aperture positions may be predetermined for particular values of temperature indicators.

The method of FIG. 7 also includes setting (408) the aperture of each identified floor tile to its aperture position. Setting (408) the aperture of each identified floor tile to its aperture position may be carried out by sending to an aperture adjustment module on one or more dynamically adjustable floor tiles the aperture position and sending an instruction to the aperture adjustment modules to position the aperture in accordance with the determined aperture position.

Exemplary embodiments of the present invention are described largely in the context of a fully functional system, dynamically adjustable floor tile, and method for cooling one or more computers in a data center. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the specification illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A dynamically adjustable floor tile for a data center, the floor tile comprising:
    a plurality of perforations;
    a dynamically adjustable aperture, wherein opening the aperture exposes one or more of the perforations to receiving airflow through the floor tile and closing the aperture blocks one or more of the perforations from receiving airflow through the floor tile; wherein the dynamically adjustable aperture consists of one of:
    a plurality of apertures and a plurality of fins, wherein the fins are attached to the adjustable floor tile to rotate and where in rotating one or more fins opens the one or more apertures and rotating one or more fins closes the one or more apertures;
    one or more apertures and one or more vanes attached to the adjustable floor tile and wherein opening the one or more vanes opens the one or more apertures and closing the one or more vanes closes the one or more apertures; or
    one or more apertures and one or more pneumatically controlled bladders attached to the adjustable floor tile and wherein deflating the one or more bladders opens the one or more apertures and inflating the one or more bladders closes the one or more apertures.

2. The adjustable floor tile of claim 1 wherein the dynamically adjustable aperture includes a plurality of apertures and a plurality of fins, wherein the fins are attached to the adjustable floor tile to rotate and where in rotating one or more fins opens the one or more apertures and rotating one or more fins closes the one or more apertures.

3. The adjustable floor tile of claim 1 wherein the dynamically adjustable aperture includes one or more apertures and one or more vanes attached to the adjustable floor tile and wherein opening the one or more vanes opens the one or more apertures and closing the one or more vanes closes the one or more apertures.

4. The adjustable floor tile of claim 1 wherein the dynamically adjustable aperture includes one or more apertures and one or more pneumatically controlled bladders attached to the adjustable floor tile and wherein deflating the one or more bladders opens the one or more apertures and inflating the one or more bladders closes the one or more apertures.

5. The adjustable floor tile of claim 1 further comprising an aperture adjustment module including a processor and computer memory and an aperture adjustment application stored in memory including computer program instructions for:
receiving, from one or more computers in the data center, temperature indicators;
determining an aperture position in dependence upon the temperature indicators; and
setting the aperture to the aperture position.

6. The adjustable floor tile of claim 4 wherein the temperature indicators include internal temperature in a chassis of computers.

7. The adjustable floor tile of claim 4 wherein the temperature indicators include current fan speed in a chassis of computers.

8. The adjustable floor tile of claim 4 wherein the temperature indicators include processor usage information for one or more of the computers.

9. The adjustable floor tile of claim 1 further comprising an aperture adjustment module including a processor and computer memory and an aperture adjustment application stored in memory including computer program instructions for:
receiving, from one or more computers in the data center, an aperture position; and
setting the aperture to the aperture position.

10. A method for cooling one or more computers in a data center, the data center including a perforated tile floor and an air conditioner for blowing cooled air beneath the perforated tile floor, and each floor tile including a dynamically adjustable aperture, the method comprising:
receiving, from one or more computers in the data center, temperature indicators;
identifying one or more floor tiles predetermined to cool the one or more computers;
determining an aperture position in dependence upon the temperature indicators for each identified floor tile; and
setting the aperture of each identified floor tile to its aperture position,
wherein the dynamically adjustable aperture consists of one of:
a plurality of apertures and a plurality of fins, wherein the fins are attached to the adjustable floor tile to rotate and where in rotating one or more fins opens the one or more apertures and rotating one or more fins closes the one or more apertures;
one or more apertures and one or more vanes attached to the adjustable floor tile and wherein opening the one or more vanes opens the one or more apertures and closing the one or more vanes closes the one or more apertures; or
one or more apertures and one or more pneumatically controlled bladders attached to the adjustable floor tile and wherein deflating the one or more bladders opens the one or more apertures and inflating the one or more bladders closes the one or more apertures.

11. The method of claim 10 wherein the temperature indicators include internal temperature in a chassis of computers.

12. The method of claim 10 wherein the temperature indicators include current fan speed in a chassis of computers.

13. The method of claim 10 wherein the temperature indicators include processor usage information for one or more of the computers.

14. The method of claim 10 wherein the dynamically adjustable aperture includes a plurality of apertures and a plurality of fins, wherein the fins are attached to the adjustable floor tile to rotate and where in rotating one or more fins opens the one or more apertures and rotating one or more fins closes the one or more apertures.

15. The method of claim 10 wherein the dynamically adjustable aperture includes one or more apertures and one or more vanes attached to the adjustable floor tile and wherein opening the one or more vanes opens the one or more apertures and closing the one or more vanes closes the one or more apertures.

16. A computer program product for cooling one or more computers in a data center, the data center including a perforated tile floor, and each floor tile including a dynamically adjustable aperture, the computer program product disposed in a recordable medium, the computer program product including computer program instructions for:
receiving, from one or more computers in the data center, temperature indicators;
identifying one or more floor tiles predetermined to cool the one or more computers;
determining an aperture position in dependence upon the temperature indicators for each identified floor tile; and
setting the aperture of each identified floor tile to its aperture position,
wherein the dynamically adjustable aperture consists of one of:
a plurality of apertures and a plurality of fins, wherein the fins are attached to the adjustable floor tile to rotate and where in rotating one or more fins opens the one or more apertures and rotating one or more fins closes the one or more apertures;
one or more apertures and one or more vanes attached to the adjustable floor tile and wherein opening the one or more vanes opens the one or more apertures and closing the one or more vanes closes the one or more apertures; or
one or more apertures and one or more pneumatically controlled bladders attached to the adjustable floor tile and wherein deflating the one or more bladders opens the one or more apertures and inflating the one or more bladders closes the one or more apertures.

17. The computer program product of claim 16 wherein the temperature indicators include internal temperature in a chassis of computers.

18. The computer program product of claim 16 wherein the dynamically adjustable aperture includes a plurality of apertures and a plurality of fins, wherein the fins are attached to the adjustable floor tile to rotate and where in rotating one or more fins opens the one or more apertures and rotating one or more fins closes the one or more apertures.

19. The computer program product of claim 16 wherein the dynamically adjustable aperture includes one or more apertures and one or more vanes attached to the adjustable floor tile and wherein opening the one or more vanes opens the one or more apertures and closing the one or more vanes closes the one or more apertures.

20. The computer program product of claim 16 wherein the dynamically adjustable aperture includes one or more apertures and one or more pneumatically controlled bladders attached to the adjustable floor tile and wherein deflating the one or more bladders opens the one or more apertures and inflating the one or more bladders closes the one or more apertures.

* * * * *